(12) United States Patent
Khailany et al.

(10) Patent No.: US 9,093,135 B2
(45) Date of Patent: Jul. 28, 2015

(54) SYSTEM, METHOD, AND COMPUTER PROGRAM PRODUCT FOR IMPLEMENTING A STORAGE ARRAY

(71) Applicant: NVIDIA Corporation, Santa Clara, CA (US)

(72) Inventors: Brucek Kurdo Khailany, San Francisco, CA (US); James David Balfour, Mountain View, CA (US); Ronny Meir Krashinsky, San Francisco, CA (US)

(73) Assignee: NVIDIA Corporation, Santa Clara, CA (US)

( * ) Notice: Subject to any disclaimer, the term of this patent is extended or adjusted under 35 U.S.C. 154(b) by 178 days.

(21) Appl. No.: 13/678,477

(22) Filed: Nov. 15, 2012

(65) Prior Publication Data
US 2014/0136778 A1    May 15, 2014

(51) Int. Cl.
| | | |
|---|---|---|
| *G06F 12/02* | (2006.01) |
| *G11C 7/12* | (2006.01) |
| *G11C 7/18* | (2006.01) |
| *G11C 8/16* | (2006.01) |
| *G11C 11/412* | (2006.01) |

(52) U.S. Cl.
CPC .. *G11C 7/12* (2013.01); *G11C 7/18* (2013.01); *G11C 8/16* (2013.01); *G11C 11/412* (2013.01)

(58) Field of Classification Search
CPC ... G06F 12/0889; G06F 12/0879; G11C 7/12; G11C 7/18; G11C 8/16; G11C 11/412
See application file for complete search history.

(56) References Cited

U.S. PATENT DOCUMENTS

| | | | |
|---|---|---|---|
| 7,778,105 B2 * | 8/2010 | Golla et al. | 365/230.05 |
| 8,705,305 B2 * | 4/2014 | Upputuri | 365/206 |
| 2006/0176729 A1 * | 8/2006 | Chan et al. | 365/154 |
| 2013/0083613 A1 * | 4/2013 | Phan et al. | 365/203 |

OTHER PUBLICATIONS

U.S. Appl. No. 13/209,189, filed Aug. 12, 2011.

* cited by examiner

*Primary Examiner* — Hiep Nguyen
(74) *Attorney, Agent, or Firm* — Zilka-Kotab, PC

(57) ABSTRACT

A system, method, and computer program product are provided for implementing a storage array. In use, a storage array is implemented utilizing static random-access memory (SRAM). Additionally, the storage array is utilized in a multithreaded architecture.

20 Claims, 7 Drawing Sheets

SYSTEM, METHOD, AND COMPUTER PROGRAM PRODUCT FOR IMPLEMENTING A STORAGE ARRAY

This invention was made with Government support under Agreement No. HR0011-10-9-0008, awarded by DARPA. The Government has certain rights in the invention.

FIELD OF THE INVENTION

The present invention relates to processor operation, and more particularly to storage arrays within a processor architecture.

BACKGROUND

Computer processors are critical to the operation of modern computing device. For example, computer processors may carry out instructions of one or more computer programs in order to process data. However, current techniques for storing registers in association with a processor have been associated with various limitations.

For example, energy and area-efficient register files may be desirable for storing thread registers and for supplying data operands at high bandwidth to function units within a processor structure. However, current attempts to produce such register files may be inefficient and may also be prohibitively expensive in terms of size, cost, and power usage. There is thus a need for addressing these and/or other issues associated with the prior art.

SUMMARY

A system, method, and computer program product are provided for implementing a storage array. In use, a storage array is implemented utilizing static random-access memory (SRAM). Additionally, the storage array is utilized in a multithreaded architecture.

DETAILED DESCRIPTION

Figure 1:
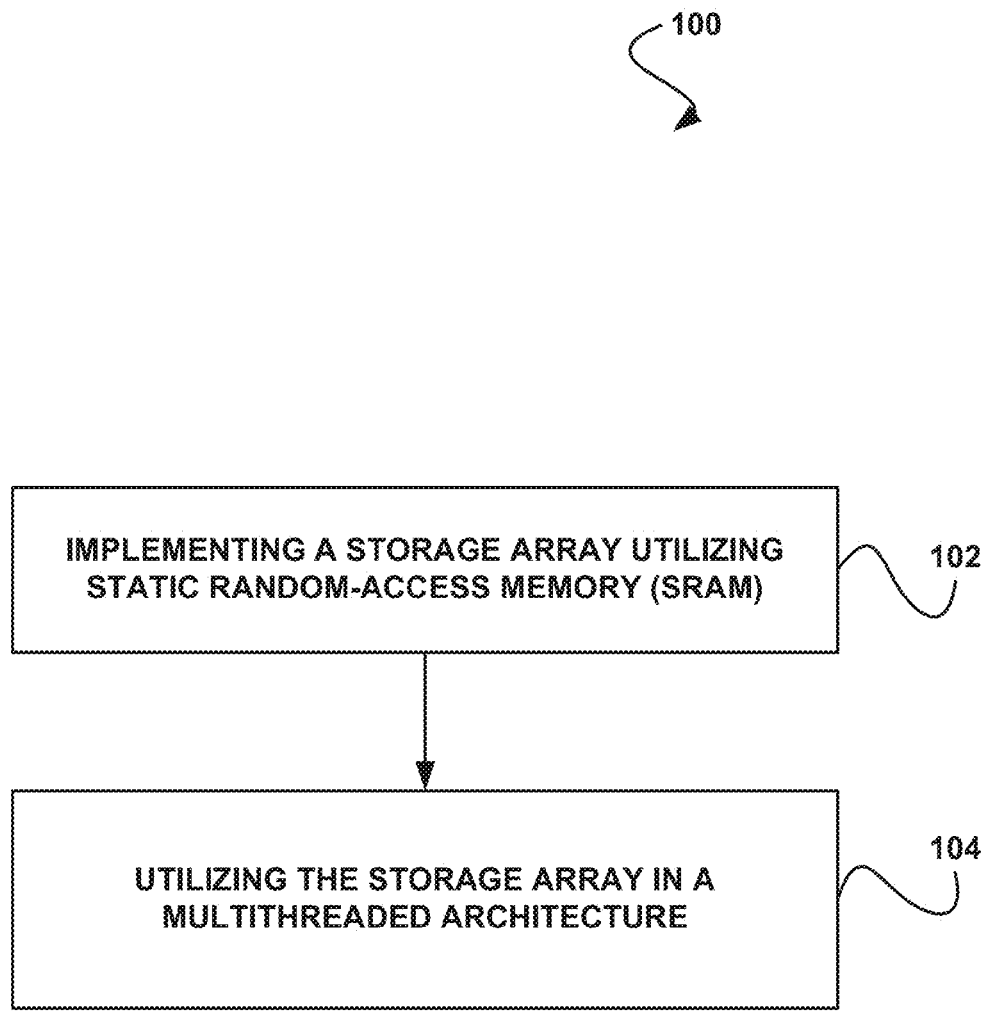
FIG. 1 shows a method for implementing a storage array, in accordance with one embodiment.

FIG. 1 shows a method 100 for implementing a storage array, in accordance with one embodiment. As shown in operation 102, a storage array is implemented utilizing static random-access memory (SRAM). In one embodiment, the storage array may include a register file. For example, the storage array may include a storage array of processor registers. In another embodiment, the storage array may be used to store thread registers and supply data operands at high bandwidth to function units. For example, the registers within the storage array may be used to stage data between memory and function units within the processor.

Additionally, in one embodiment, the storage array may be included within a processor. For example, the storage array may include a register the that is included within a streaming multiprocessor. In another embodiment, the storage array may be implemented utilizing hierarchically multi-ported static random-access memory (HM-SRAM). For example, the storage array may be implemented utilizing an SRAM utilizing hierarchical bitlines with a single port on local bitlines but multiple ports on global bitlines. In another example, the storage array may be built utilizing SRAM storage cells (e.g., 6 transistor (6T) SRAM cells, 8 transistor (8T) SRAM cells, etc).

Further, in one embodiment, the storage array may include a plurality of sub-arrays. In another embodiment, each sub-array may include a plurality of rows and columns of SRAM storage cells. In yet another embodiment, each row of a sub-array may be accessed utilizing a write word line and a read word line. In still another embodiment, each column of a sub-array may include local differential write bit lines and a local read bit line. In another embodiment, each sub-array may include a global read bit line and a global write bit line.

Further still, in one embodiment, the storage array may include a plurality of rows and columns of sub-arrays. For example, the storage array may be constructed of a plurality of sub-arrays with independent multiplexing for read ports on global read hit lines. In another embodiment, a single-ended global write bit line may be broadcast to all sub-arrays within the storage array. In yet another embodiment, the single-ended global write bit line may be sent to a local write bit line driver within each sub-array.

Also, in one embodiment, each sub-array within the storage array may have a control bundle. In another embodiment, each sub-array within the storage array may have a dedicated global read bit line which is sent to a plurality of global read multiplexer blocks (e.g., three global read mux blocks, etc.). For example, each read multiplexer may select from a plurality of global read hit lines and may produce a single output (e.g., a 32-bit output, etc.) per port for the sub-array.

In addition, in one embodiment, within a sub-array of the storage array, multiple read ports may be supported utilizing dedicated global read bit lines. In another embodiment, entries within a sub-array of the storage array may be mapped to different threads to avoid sub-array read and write conflicts. In yet another embodiment, an average read energy for the storage array may be reduced by avoiding read precharges for sequential address reads from the same physical row within the storage array and by holding a read word line high for multiple cycles.

Furthermore, in one embodiment, local sub-array reads may be decoupled from global bit line read multiplexers within the storage array. In another embodiment, multiple write port operation may be supported within the storage array by adding additional global word bit lines and a write multiplexer cell for each sub-array within the storage array. In yet another embodiment, a shared global read bit line per port may be implemented within the storage array.

Further still, in one embodiment, a dynamic pre-charge may be placed on each global read bit line of the storage array and a dynamic pull-down may be implemented for each sub-array for the storage array. In another embodiment, a full crossbar may be implemented between local and global bit lines of the storage array, such that, one sub-array of the storage array may read a plurality of different SRAM cells in one cycle.

In yet another embodiment, within the storage array, separate control may be used for local bit lines and global bit lines, such that local bit lines may have a single read port, and global bit lines may have multiple read ports. In another embodiment, within the storage array, the selection between threads may occur on a local bit line, and the selection of which register to use for the thread may occur on global bit lines.

Also, as shown in operation 104, the storage array is utilized in a multithreaded architecture. In one embodiment, the storage array may be multithreaded. In another embodiment, the storage array may be used for storing thread registers within a multi-threaded environment. In yet another embodiment, the registers within the storage array may be used to stage data between memory and function units within a streaming multiprocessor (e.g., a graphics processing unit (GPU), etc.).

In this way, the storage array may include a SRAM-based storage array multi-ported access. Also, the storage array may be denser than multi-ported arrays built out of latches or register file cells. Additionally, more efficient conflict-free access patterns may be supported by the storage array when compared to arrays using SRAM banking. Further, the storage array may allow all operands from a thread to be read in a single cycle, which may result in improved performance and energy usage.

Further still, by using SRAM storage cells and implementing a hierarchical multi-porting concept with column multiplexing of the SRAM cells, the storage array may be efficiently used within streaming multithreaded processors. Also, the storage array may be used as a more efficient substitute for SRAM banking for dense on-chip storage arrays requiring a high bandwidth to capacity ratio.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
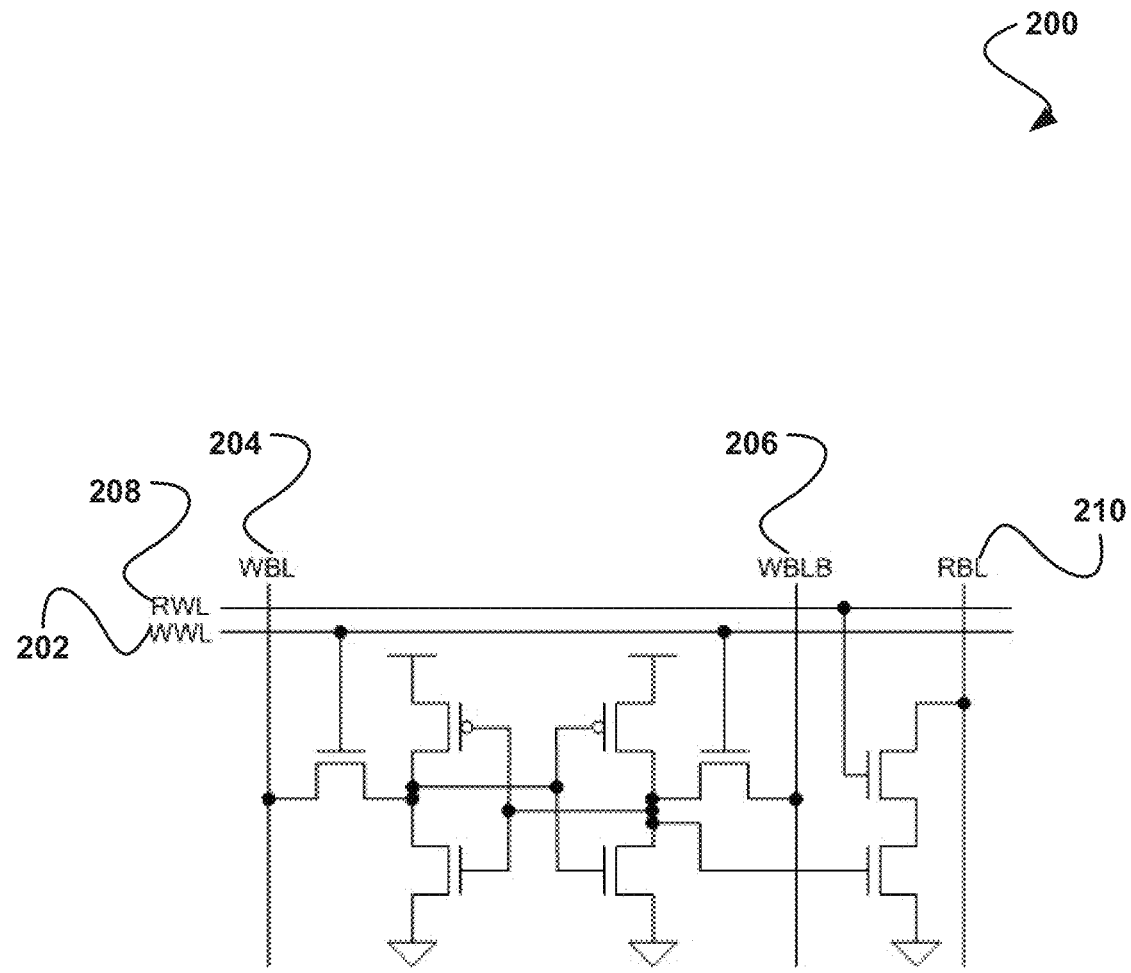
FIG. 2 shows an exemplary 8T SRAM storage cell, in accordance with another embodiment.

FIG. 2 shows an exemplary 8T SRAM storage cell 200, in accordance with another embodiment. As an option, the 8T SRAM storage cell 200 may be carried out in the context of the functionality of FIG. 1. Of course, however, the 8T SRAM storage cell 200 may be implemented in any desired environment. It should also be noted that the aforementioned definitions may apply during the present description.

As shown, the 8T SRAM storage cell 200 includes a write word line (WWL) 202 and full-swing differential write bit lines, WBL 204 and WBLB 206. In one embodiment, the write word line (WWL) 202 and full-swing differential write bit lines WBL 204 and WBLB 206 may be used for performing writes within the 8T SRAM storage cell 200.

Additionally, the 8T SRAM storage cell 200 includes a read word line (RWL) 208 and a single-ended full-swing read bit line (RBL) 210. In one embodiment, the read word line (RWL) 208 and single-ended full-swing read bit line (RBL) 210 may be used for performing reads within the 8T SRAM storage cell 200. In another embodiment, an HM-SRAM may be constructed utilizing a plurality of 8T SRAM storage cells 200.

Figure 3:
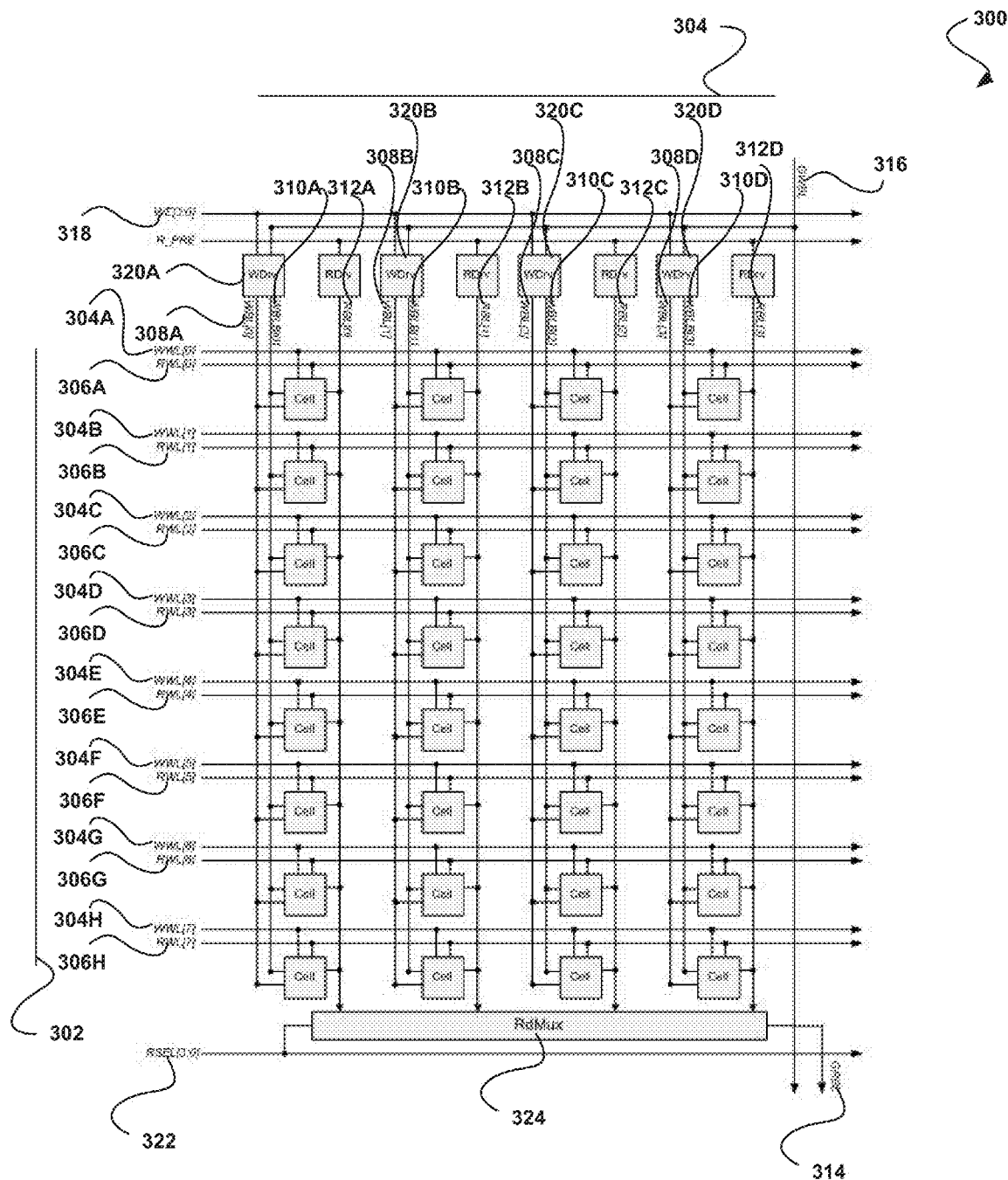
FIG. 3 shows an exemplary single bit wide portion of an 8×4 sub-array, in accordance with another embodiment.

FIG. 3 shows an exemplary single bit wide portion of an 8×4 sub-array 300, in accordance with another embodiment. As an option, the exemplary 8×4 sub-array 300 may be carried out in the context of the functionality of FIGS. 1-2. Of course, however, the exemplary 8×4 sub-array 300 may be implemented in any desired environment. It should also be noted that the aforementioned definitions may apply during the present description.

As shown, the single bit wide portion of the 8×4 sub-array 300 includes a plurality of storage cell rows 302 and a plurality of storage cell columns 304. Additionally, each row 302 of the sub-array is addressed by a write word line (WWL[i]) 304A-H, and a read word line (RWL[i]) 306A-H. Each column 304 contains full-swing local differential write bit lines WBL[i] 308A-D and WBL_B[i] 310A-D, and a local read bit line (RBL[i]) 312A-D. Each sub-array also contains a global read bit line (GRBL) 314, and one global write bit line (GWBL) 316.

Additionally, in one embodiment, an HM-SRAM may be constructed out of sub-arrays 300, with a 2D array of 8T storage cells in each sub-array 300. In another embodiment, HM-SRAMs may be constructed from multiple wide sub-arrays 300. For example, a 256-entry 64-bit HM-SRAM may contain eight 64-bit-wide 8×4 sub-arrays (each sub-array may contain eight physical rows and 256 physical columns).

Further, in one embodiment, during a write operation, write data may be broadcast to all sub-arrays on GWBL 316. The zero-hot or one-hot write enables for each sub-array (WE[3:0]) 318 may control whether or not to drive one of the differential local write bit lines 308A-D low during a write operation on each cycle. This may be performed with two NAND gates (e.g., one for each of the differential local bit lines, etc.) and an inverter in the WDrv cell 320A-D to invert the write data.

Further still, in one embodiment, to write new data into one of the cells in the sub-array 300, the inactive columns may keep both WBL[i] 308A-D and WBL_B[i] 310A-D high, while the active column may drive one of the local write bit lines to zero, similar to a write in a typical multi-column SRAM. In another embodiment, driving WWL[i] 304A-H for the active row high may control which cell in the sub-array gets written.

Also, in one embodiment, during a read operation, after pre-charging the single-ended local read bit lines, one read word line in each sub-array 300 may be driven high, which may cause that column's local read bit line to pull down if a zero is read from the storage cell (e.g., the bit line is held high if a one is read, etc.). The one-hot RSEL[3:0] signal 322 may control a column mux (RdMux) 324 to select which local read bit line to sense and in turn drive onto a global read bit line (GRBL) 314.

In addition, in one embodiment, an HM-SRAM may contain a dedicated global read bit line per sub-array. With dedicated global read bit lines, the global read bit line driver may be a static CMOS inverter or buffer since the GRBL may not need to be precharged and dynamically discharged like the local read bit lines. Care may be taken to avoid driving a global read bit line until the local read bit line has settled to a 1 or a 0 in order to avoid spurious transitions that dissipate energy on the global read bit line.

Figure 4:
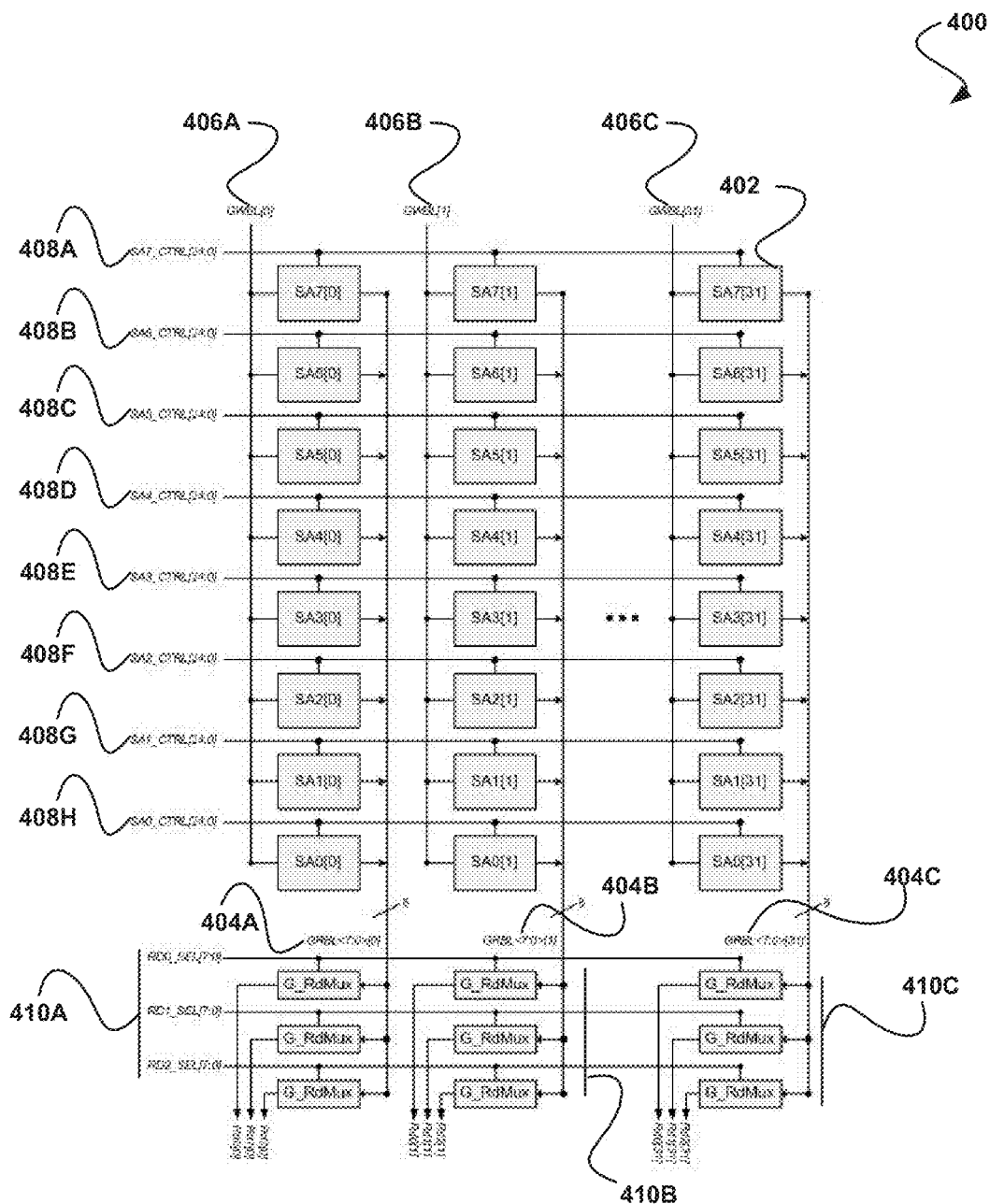
FIG. 4 shows an exemplary HM-SRAM, in accordance with another embodiment.

FIG. 4 shows an exemplary HM-SRAM 400, in accordance with another embodiment. As an option, the exemplary HM-SRAM 400 may be carried out in the context of the functionality of FIGS. 1-3. Of course, however, the exemplary HM-SRAM 400 may be implemented in any desired environment. It should also be noted that the aforementioned definitions may apply during the present description.

As shown, the HM-SRAM 400 is constructed of multiple sub-arrays 402 with independent muxing for read ports on the global read bit lines 404A-C. Additionally, the HM-SRAM 400 is an exemplary 256-entry 32-bit-wide 3-read-port 1-write-port HM-SRAM. In one embodiment, the HM-SRAM 400 may contain eight 8×4 (32-entry) sub-arrays per bit for a total of 256 entries with eight sub-arrays. In another embodiment, the HM-SRAM 400 may have a layout with 8*8=64 total rows and 4*32=128 total columns.

Additionally, as shown, a single-ended global write bit line (GWBL[i]) 406A-C is broadcast to all sub-arrays and sent to the local write bit line driver in each sub-array. Each sub-array contains a control bundle (SA<i>_CTRL[24:0]) 408A-H. In one embodiment, the twenty-five bits in the control bundle may include the signals WE[3:0], RE_PRE, WWL[7:0], RWL[7:0], and RSEL[3:0] shown in FIG. 3 and may be driven by an address decoder. Each sub-array contains a dedicated global read bit line 404A-C that is sent to three global RdMux blocks 410A-C at the bottom of the HM-SRAM 400. In one embodiment, each RdMux 410A-C may select from eight global read bit lines with an 8:1 multiplexer, and may produce one 32-bit output per read port for the HM-SRAM 400.

Further, in one embodiment, multiple read ports may be supported in the HM-SRAM 400 using dedicated global read bit lines as long as two entries from the same sub-array are not read on the same cycle. This approach may be a good fit for multi-threaded register file implementations where it is common to use time-slicing such that on any cycle, only entries from one thread may be read. In another embodiment, in the HM-SRAM 400, the entries within a sub-array may be mapped to different threads to avoid sub-array read and write conflicts. For example, the 256-entry 32-bit HM-SRAM 400 contains 8×4 sub-arrays and may be well suited as a 32-thread register file supporting 8 32-bit registers per thread.

Further still, in one embodiment, the thirty two storage cells within a sub-array may correspond to a single bit from a single register address across thirty two threads. Also, the eight rows of sub-arrays may correspond to eight registers. On any given cycle, three registers may be read from the same thread. In another embodiment, with the HM-SRAM 400, the read word line for only the three active sub-arrays may be driven high on that cycle and three of the global read bit lines may get updated with new values. Each G_RdMux 410A-C may then select the appropriate global read bit line for that read port.

Also, in one embodiment, additional complexity may be introduced into the address decoder circuitry of the HM-SRAM 400. For example, assuming a 256-entry HM SRAM 400 with three read ports accepts an 8-bit address per read port, 3 msbs of the address may be used to detect which of the 8 sub-arrays to activate and the 5 labs may be used to select a particular entry within a sub-array. In the case of a multi-threaded RF, the lsbs may correspond to a thread ID and may be identical for all three read ports.

In addition, in one embodiment, the msbs may be decoded into the 1-hot RD<i>_SEL signals controlling the G_RdMux blocks 410A-C and then the decoded values may be OR'ed together to compute the R_PRE signals sent to each sub-array controlling the local read bit line precharge. In another embodiment, the three active rows of sub-arrays may decode the lsbs into the one-hot RWL and RSEL signals. In yet another embodiment, inactive sub-arrays may hold their RWL and RSEL signals low to avoid wasting power on that cycle. With a single write port, decoding may be simpler for writes, but would occur in a similar manner.

Furthermore, in one embodiment, when sequential addresses from the same physical row are read over subsequent cycles in the HM-SRAM 400, it may be possible to reduce average read energy by avoiding read precharges for the subsequent accesses and by holding the read word line high for multiple cycles. This optimization may be particularly relevant in multi-threaded register files using temporal SIMT scheduling. See, for example, U.S. application Ser. No. 13/209,189, filed Aug. 12, 2011, which discloses exemplary temporal SIMT scheduling in a GPU and which is hereby incorporated by reference in its entirety. In another embodiment, sequential threads may be stored in the same physical row and the read energy for the last three out of four threads may be much lower because no dynamic energy may be dissipated on the local read bit lines.

Further still, in one embodiment, another optimization possible with HM-SRAMs 400 that use dedicated global read bit lines may be to further decouple the local sub-array reads from the global bit line read muxes. This approach may be suitable to architectures where a thread ID is known well in advance and changes relatively infrequently compared to register addresses, which may change every cycle. In these architectures, one or more sub-arrays may be read once based on thread ID. Then, if the thread ID does not change for a number of subsequent cycles, read word lines may be held high and sub-array local read bit line precharges may be avoided, holding the sub-array read values on dedicated global read bit lines. As register addresses for that thread ID are encountered, only the global read muxes may need to be changed, which may lead to very low energy per access and fast access times.

Figure 5:
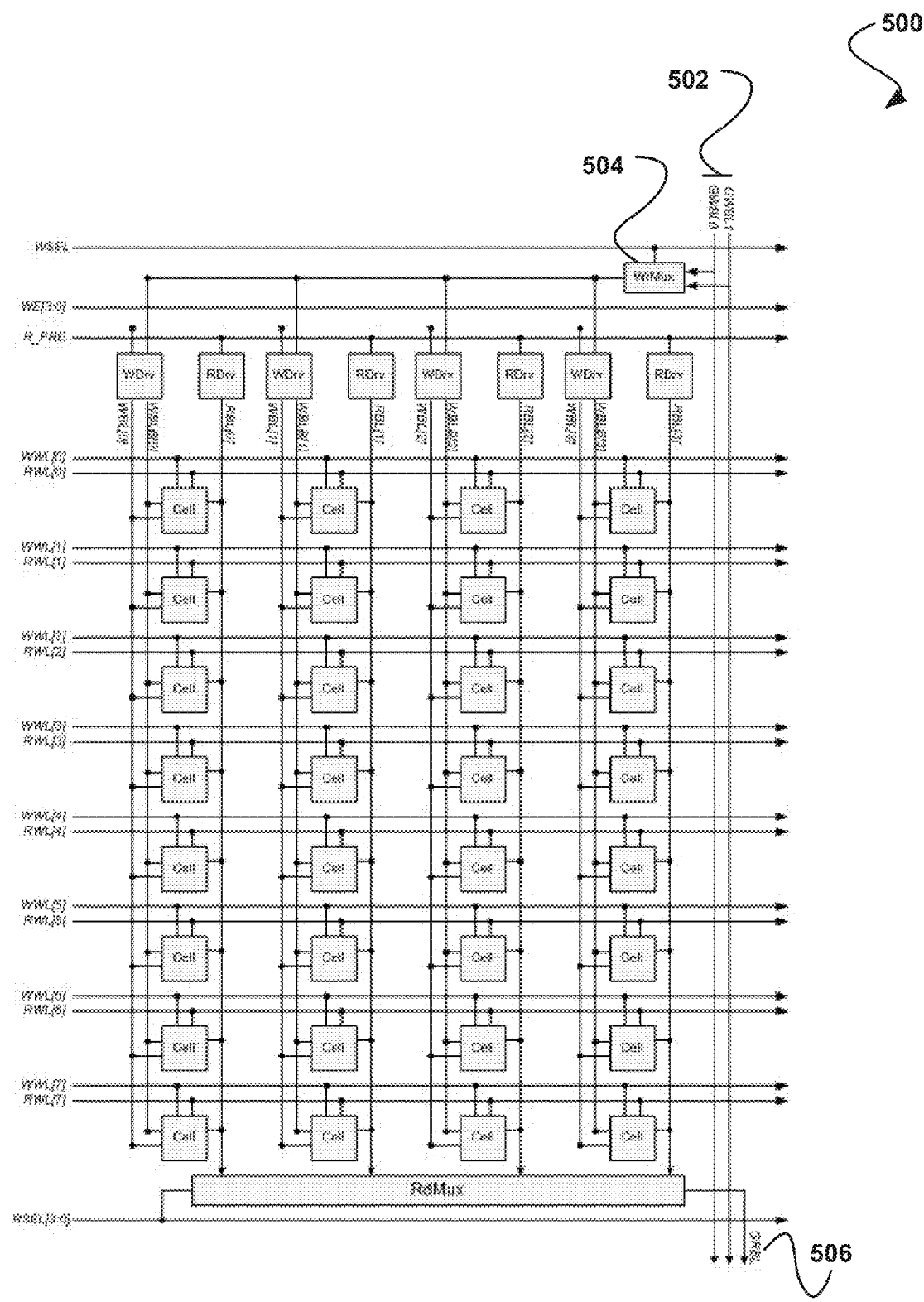
FIG. 5 shows an exemplary HM-SRAM that supports multiple-write-port operation, in accordance with another embodiment.

FIG. 5 shows an exemplary HM-SRAM 500 that supports multiple-write-port operation, in accordance with another embodiment. As an option, the exemplary HM-SRAM 500 may be carried out in the context of the functionality of FIGS. 1-4. Of course, however, the exemplary HM-SRAM 500 may be implemented in any desired environment. It should also be noted that the aforementioned definitions may apply during the present description.

As shown, the HM-SRAM 500 is extended to support multiple-write-port operation by adding additional global word bit lines 502 and a write mux cell 504 for each sub-array. In one embodiment, an additional WSEL control signal may select one of the global write bit lines to be written to each sub-array on a given cycle. In another embodiment, multiple write ports may be used with the HM-SRAM 500 as long as the two write addresses do not target the same sub-array. For example, if the thirty two entries in a sub-array are mapped to thirty two threads in a multi-threaded register, file, then multiple write ports may not write the same register from two different threads in the same cycle. This situation may be avoided through arbitration and scheduling in a multi-threaded processor.

Figure 6:
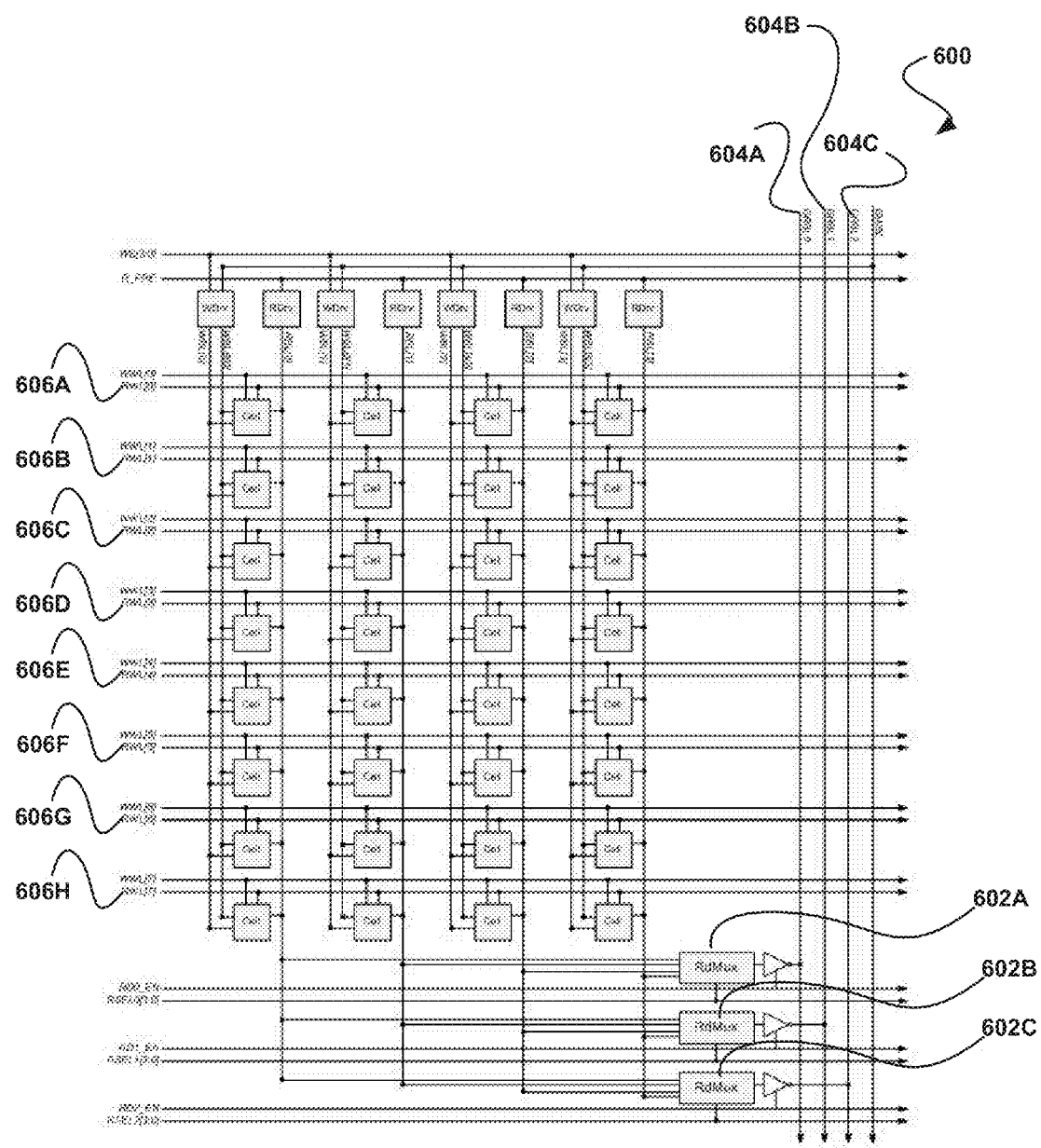
FIG. 6 shows an exemplary HM-SRAM with shared global read bit lines, in accordance with another embodiment.

FIG. 6 shows an exemplary HM-SRAM 600 with shared global read bit lines, in accordance with another embodiment. As an option, the exemplary HM-SRAM 600 may be carried out in the context of the functionality of FIGS. 1-5. Of course, however, the exemplary HM-SRAM 600 may be implemented in any desired environment. It should also be noted that the aforementioned definitions may apply during the present description.

As shown in the 8×4 sub-array of the HM-SRAM 600, there are three sets of local read muxes (RdMux) 602A-C, each with their own independent control wires. Each local RdMux 602A-C drives a shared global read 604A-C bit line using a tristate buffer, such that only one sub-array may drive one global read bit line on any given cycle. In one embodiment, because each sub-array contains three RdMux blocks 602A-C, a full crossbar may be implemented between local and global bit lines and it may be possible for one sub-array to read three different SRAM cells in one cycle, as long as they are in the same physical row.

This may be useful in HM-SRAMs with fewer numbers of threads and more registers per thread. For example, in one embodiment, rather than limiting the thirty two entries in 8×4 sub-arrays to thirty two threads in a multi-threaded register file, the HM-SRAM 600 may also be mapped to eight threads with four registers per thread per sub-array. This design may enable fully multi-ported access as long as a single thread's registers are stored in the same physical row. In another embodiment, the read word line (RWL[i]) 606A-H may select the active thread in any sub-arrays being accessed on a given cycle, but the three column muxes may operate independently and potentially select values from three different columns within the same sub-array to drive onto the tristated global read bit lines.

Also, in one embodiment, the HM-SRAM may use separate control for local and global SRAM bit lines to provide multi-ported access at high bandwidth to a large SRAM-based storage array, as long as a non-conflicting set of addresses are provided. In another embodiment, conflicting address patterns may be easier to avoid with an UM-SRAM than with traditional SRAM banking. In fact, conflicts may be completely avoided if the HM-SRAM is used as a multi-threaded RF with strict time-slicing per thread.

Additionally, in one embodiment, the HM-SRAM may be used for any dense on-chip storage array requiring a high bandwidth-to-capacity ratio where SRAM banking is needed to achieve the desired bandwidth. With respect to the application of HM-SRAMs to multi-threaded register files in streaming multiprocessors with a two-level register file hierarchy, an HM-SRAM may be used as an MRF (Main Register File) replacement or as an ORF (Operand Register File) replacement. As an ORF replacement, the HM-SRAM may be significantly denser since it relies on SRAM storage cells rather than latch cells, which may enable much higher-capacity ORFs within the same area footprint. This higher-capacity ORF may be expected to be beneficial to overall energy efficiency in many SM architectures.

In this way, the HM-SRAM design may be significantly denser than multi-ported register files built out of latches or register file cells, since 8T SRAM cells may be used for the storage. In one embodiment, latches or register-file cells may be used and widely multi-threaded register files may be implemented. Additionally, the HM-SRAM approach may support conflict-free access patterns more efficiently than using SRAM banking with traditional 6T single-port, 6T pseudo-dual-port, or 8T dual-port SRAM cells.

Further, HM-SRAM may allow all operands from a thread to easily be read in a single cycle. The HM-SRAM single-cycle operand read approach may provide enhanced performance in the presence of control divergence across threads and may also avoid energy and area overheads associated with collectors. Further still, the HM-SRAM may be able to use 8T SRAM storage cells and may fold a hierarchical multi-porting concept into the column muxing of the SRAM itself with very little overhead, which may make the HM-SRAM suitable to processors with a large number of threads (e.g., greater than sixteen threads, etc.).

Figure 7:
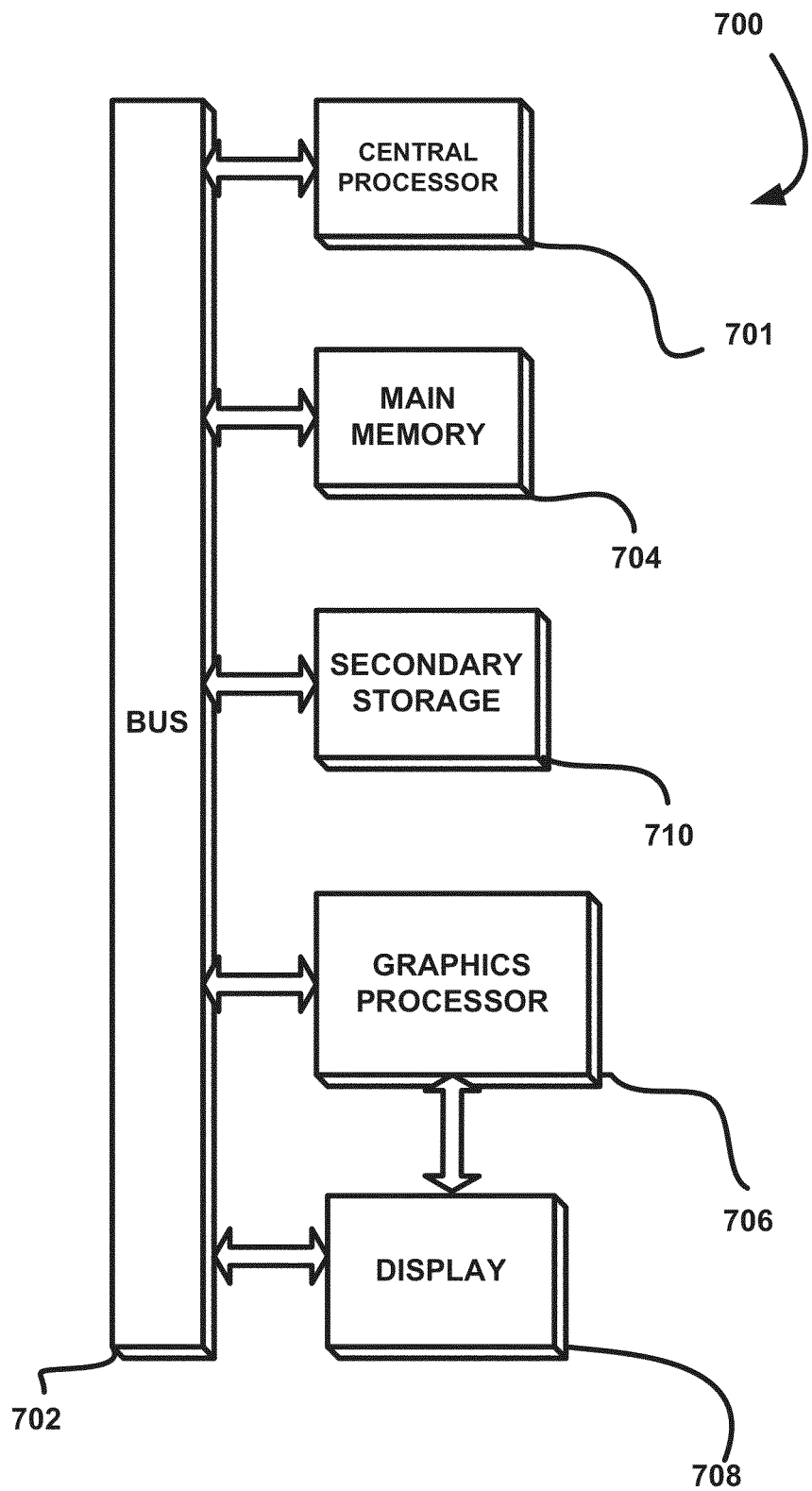
FIG. 7 illustrates an exemplary system in which the various architecture and/or functionality of the various previous embodiments may be implemented.

FIG. 7 illustrates an exemplary system 700 in which the various architecture and/or functionality of the various previous embodiments may be implemented. As shown, a system 700 is provided including at least one host processor 701 which is connected to a communication bus 702. The system 700 also includes a main memory 704. Control logic (software) and data are stored in the main memory 704 which may take the form of random access memory (RAM).

The system 700 also includes a graphics processor 706 and a display 708, i.e. a computer monitor. In one embodiment, the graphics processor 706 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 700 may also include a secondary storage 710. The secondary storage 710 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 704 and/or the secondary storage 710. Such computer programs, when executed, enable the system 700 to perform various functions. Memory 704, storage 710 and/or any other storage are possible examples of computer-readable media.

In one embodiment, the architecture and/or functionality of the various previous figures may be implemented in the context of the host processor 701, graphics processor 706, an integrated circuit (not shown) that is capable of at least a portion of the capabilities of both the host processor 701 and the graphics processor 706, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 700 may take the form of a desktop computer, laptop computer, and/or any other type of logic. Still yet, the system 700 may take the form of various other devices no including, but not limited to a personal digital assistant (PDA) device, a mobile phone device, a television, etc.

Further, while not shown, the system 700 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A storage array, comprising:
   a plurality of sub-arrays configured to provide a register for each thread of a plurality of threads, each sub-array configured to store one bit of the register for each thread, and each sub-array comprising:

storage cells configured in an array of rows and columns, wherein each storage cell is associated with a different thread of the plurality of threads and stores one bit of data;

a read multiplexer coupled to the storage cells and configured to output a global read bit line selected from local read bit lines output by the storage cells;

read drivers, each read driver coupled between a read bit line precharge and one of the columns; and write drivers, each write driver coupled between a global write bit line and one of the columns, and configured to write the global write bit line to the storage cells for each thread of the plurality of threads.

2. The storage array of claim 1, wherein, within the storage array, the plurality of sub-arrays are configured into at least one row of the sub-arrays and columns of the sub-arrays.

3. The storage array of claim 2, further comprising a plurality of global write bit lines, wherein each one of the global write bit lines is coupled to the global write bit line of each sub-array in one of the columns of the sub-arrays.

4. The storage array of claim 2, further comprising a plurality of global read multiplexers, each global read multiplexer coupled to the global read bit line of each sub-array within one column of the sub-arrays and configured to select one of the global read bit lines for output.

5. The storage array of claim 2, wherein a read word line coupled to the storage cells in a first row of the sub-arrays is held high for subsequent cycles when the storage cells in the first row are read during the subsequent cycles.

6. The storage array of claim 5, wherein the read bit line precharge for each of the storage cells in the first row of the sub-arrays does not precharge the local read bit lines of the storage cells in the first row of the sub-arrays during the subsequent cycles.

7. The storage array of claim 1, wherein the plurality of sub-arrays further comprises additional sub-arrays to provide a second register for each thread of the plurality of threads, and each additional sub-array is configured to store one bit of the second register for each thread.

8. The storage array of claim 7, wherein, within the storage array, the plurality of sub-arrays are configured into rows of the sub-arrays and columns of the sub-arrays, and the register and the second register for a first thread of the plurality of threads is configured within a single row of the rows of the sub-arrays.

9. The storage array of claim 7, wherein, within the storage array, the plurality of sub-arrays are configured into rows of the sub-arrays and columns of the sub-arrays, and the register is associated with a first row of the rows of the sub-arrays and the second register is associated with a second row of the rows of the sub-arrays.

10. The storage array of claim 1, each sub-array further comprising, a write multiplexer cell that is coupled between the global write bit line and each write driver, and configured to select one of the global write bit line and an additional global write bit line to write to the storage cells for each thread of the plurality of threads.

11. The storage array of claim 1, each sub-array further comprising, an additional global write bit line to store to the storage cells for each thread of the plurality of threads.

12. The storage array of claim 1, wherein each sub-array further comprises a second read multiplexer that is coupled to the storage cells and configured to output a second global read bit line selected from the local read bit lines output by the storage cells.

13. The storage array of claim 1, each sub-array further comprising a control bundle including write enables, the read bit line precharge, write word lines, read word lines, and read select signals.

14. The storage array of claim 1, wherein each storage cell comprises a static random access memory cell.

15. The storage array of claim 1, wherein, during one cycle, a first storage cell in the sub-array is written and a second storage cell in the sub-array is read.

16. A system, comprising:
a streaming multiprocessor comprising:
a function unit; and
a storage array coupled to the function unit, the storage array comprising:
a plurality of sub-arrays configured to provide a register for each thread of a plurality of threads, each sub-array configured to store one bit of the register for each thread, and each sub-array comprising:
storage cells configured in an array of rows and columns, wherein each storage cell is associated with a different thread of the plurality of threads and stores one bit of data;
a read multiplexer coupled to the storage cells and configured to output a global read bit line selected from local read bit lines output by the storage cells;
read drivers, each read driver coupled between a read bit line precharge and one of the columns; and
write drivers, each write driver coupled between a global write bit line and one of the columns, and configured to write the global write bit line to the storage cells for each thread of the plurality of threads.

17. The system of claim 16, wherein, within the storage array, the plurality of sub-arrays are configured into at least one row of the sub-arrays and columns of the sub-arrays.

18. The system of claim 17, further comprising a plurality of global write bit lines, wherein each one of the global write bit lines is coupled to the global write bit line of each sub-array in one of the columns of the sub-arrays.

19. The system of claim 16, wherein the plurality of sub-arrays further comprises additional sub-arrays to provide a second register for each thread of the plurality of threads, and each additional sub-array is configured to store one bit of the second register for each thread.

20. The system of claim 16, each sub-array further comprising, a write multiplexer cell that is coupled between the global write bit line and each write driver, and configured to select one of the global write bit line and an additional global write bit line to write to the storage cells for each thread of the plurality of threads.

* * * * *